(12) United States Patent
Patel et al.

(10) Patent No.: US 8,618,625 B2
(45) Date of Patent: Dec. 31, 2013

(54) SILICON-BASED SCHOTTKY BARRIER DETECTOR WITH IMPROVED RESPONSIVITY

(75) Inventors: Vipulkumar Patel, Breinigsville, PA (US); Prakash Gothoskar, Allentown, PA (US); Mark Webster, Bethlehem, PA (US); Christopher J. Lang, New Tripoli, PA (US)

(73) Assignee: Cisco Technology, Inc., San Jose, CA (US)

( * ) Notice: Subject to any disclaimer, the term of this patent is extended or adjusted under 35 U.S.C. 154(b) by 476 days.

(21) Appl. No.: 13/038,470

(22) Filed: Mar. 2, 2011

(65) Prior Publication Data

US 2011/0221019 A1 Sep. 15, 2011

Related U.S. Application Data

(60) Provisional application No. 61/339,855, filed on Mar. 10, 2010.

(51) Int. Cl.
*H01L 31/0224* (2006.01)
(52) U.S. Cl.
USPC ........................................................ 257/454
(58) Field of Classification Search
USPC ................... 257/453–456, E29.143
See application file for complete search history.

(56) References Cited

U.S. PATENT DOCUMENTS

| 6,211,560 B1 | 4/2001 | Jimenez et al. |
| 7,132,656 B2 | 11/2006 | Xu et al. |
| 7,358,585 B2 * | 4/2008 | Patel et al. .................... 257/454 |
| 2009/0261445 A1 | 10/2009 | Sugino |

FOREIGN PATENT DOCUMENTS

| EP | 0993053 | 4/2000 |
| EP | 2105963 | 9/2009 |
| JP | 3684149 | 8/2005 |
| JP | 2008-051522 | 3/2008 |

* cited by examiner

*Primary Examiner* — Cuong Q Nguyen
(74) *Attorney, Agent, or Firm* — Patterson & Sheridan, LLP

(57) ABSTRACT

A planar, waveguide-based silicon Schottky barrier photodetector includes a third terminal in the form of a field plate to improve the responsivity of the detector. Preferably, a silicide used for the detection region is formed during a processing step where other silicide contact regions are being formed. The field plate is preferably formed as part of the first or second layer of CMOS metallization and is controlled by an applied voltage to modify the electric field in the vicinity of the detector's silicide layer. By modifying the electric field, the responsivity of the device is "tuned" so as to adjust the momentum of "hot" carriers (electrons or holes, depending on the conductivity of the silicon) with respect to the Schottky barrier of the device. The applied potential functions to align with the direction of momentum of the "hot" carriers in the preferred direction "normal" to the silicon-silicide interface, allowing for an increased number to move over the Schottky barrier and add to the generated photocurrent.

12 Claims, 2 Drawing Sheets

BAND DIAGRAM $P(E) = (1 - \cos\theta)/2$

SILICON-BASED SCHOTTKY BARRIER DETECTOR WITH IMPROVED RESPONSIVITY

CROSS-REFERENCE TO RELATED APPLICATIONS

This application claims the benefit of U.S. Provisional Application No. 61/339,855, filed Mar. 10, 2010 and herein incorporated by reference.

TECHNICAL FIELD

The present invention relates to a silicon-based Schottky barrier infrared (IR) optical detector and, more particularly, to a planar, waveguide-based IR optical detector including an additional field plate to improve the responsivity of the detector.

BACKGROUND OF THE INVENTION

Semiconductor devices using metal-semiconductor barriers (referred to as Schottky barriers) instead of p-n junctions have been developed to convert incident light into electrical energy. Silicon is often used as the semiconductor material in Schottky barrier photodetectors operating in the IR portion of the electromagnetic energy spectrum. In its most conventional form, a silicon-based Schottky barrier photodiode consists of a thin metallic film (such as a silicide film) disposed on a silicon layer. Incident light is applied perpendicular to (i.e., "normal to") this structure, passing through the relatively thin metallic film, where the thin film absorbs only a portion of the light, thus resulting in extremely low external quantum efficiency levels. As a result, conventional "normal incidence" photodetectors require a relatively large active detection area in order to collect a sufficient amount of optical energy to function properly. However, as the detection area increases, the dark current (unwanted noise signal) increases as well. Moreover, while relatively simple in structure, such normal incidence detectors typically require cooling, again associated with a relatively high dark current value.

Improvements in optical absorption and quantum efficiency in silicon-based Schottky barrier photodetectors have been the source of much investigation over the years. In one case, the optical absorption has been improved by inducing a surface plasmon mode at the metal-semiconductor interface, as disclosed in U.S. Pat. No. 5,685,919 issued to K. Saito et al. on Nov. 11, 1997. In this arrangement, a semicylindrical lens is disposed over the metallic layer and used to re-orient the incoming light from normal incidence to an angle associated with creating the surface plasmon layer. U.S. Pat. No. 4,857,973, issued to A. C. Yang et al. on Aug. 15, 1989 discloses an alternative Schottky barrier photodetector arrangement, where the photodetector is monolithically integrated with a single crystal silicon rib waveguide and positioned to absorb the "tail" of the optical signal as it passes along the rib waveguide underneath a silicide layer. While an improvement in absorption efficiency may be achieved with the Yang et al. structure, significant losses remain in terms of scattering losses along the sidewalls of the rib waveguide structure inasmuch as the rib is created by partially removing portions of a relatively thick silicon layer. Moreover, significant difficulties remain in terms of controlling the dimensions (particularly the height), as well as the smoothness, of such a rib waveguide structure. Indeed, the implementation of a "rib" structure (particularly with sub-micron dimensions) is extremely difficult with CMOS-based conventional processing technologies. Further, the non-planar geometry of the Yang et al. structure is not considered as a preferred arrangement from a manufacturing point of view, particularly in terms of the reliability and robustness of the design.

An exemplary prior art silicon-based photodetector that is compatible with conventional CMOS processing is described in U.S. Pat. No. 7,358,585, issued to V. Patel et al. on Apr. 15, 2008 and assigned to the assignee of this application. In the Patel et al. structure, a silicide layer (or other appropriate metallic layer) is disposed over a planar silicon waveguide layer formed as a sub-micron thick surface layer of a "silicon-on-insulator" (SOI) structure (this sub-micron surface waveguide layer often referred to in the art as the "SOI layer"). Ohmic contacts are applied to both the planar SOI layer of the SOI structure and the silicide layer. An optical signal propagating laterally along the optical waveguide within the planar SOI layer will thus pass under the silicide layer, where the "tail" of the optical energy will intercept the silicide and be converted into electrical energy. Since the arrangement of Patel et al. is based on implementing a silicide detector on a planar silicon surface and does not require the formation of a single crystal silicon rib waveguide, significant improvements in efficiency over the structure of Yang et al. can be realized, while also being compatible with conventional planar CMOS processing technologies.

While considered to be an advance over existing devices, the planar, waveguide-based structure of Patel et al. has been found to be somewhat limited in its responsivity, associated with the inherent properties of the silicide material itself. Inasmuch as silicide detectors were initially designed for use in power monitoring applications, responsivity and processing simplicity were not the concerns that they are today.

Thus, a need remains for a high speed silicon-based detector that remains compatible with standard CMOS processing, yet provides the responsivity required for use as a power monitor or feedback detector in high speed systems.

SUMMARY OF THE INVENTION

The need remaining in the prior art is addressed by the present invention, which relates to a silicon-based Schottky barrier infrared (IR) optical detector and, more particularly, to a planar, waveguide-based IR optical detector including an additional field plate to improve the responsivity of the detector.

In accordance with the present invention, a separate conductive region (i.e., "field plate") is disposed over, and separated from the silicide layer forming the detector itself. Preferably, a conventional metal layer being used for other purposes (for example, the first layer of the standard metal conductor fabrication process) in a multi-layer metallization step in a CMOS fabrication process is used to create the field plate without needing to change any steps in the process. Moreover, it is preferred that the silicide layer used to form the detector itself is fabricated during the same processing step (i.e., defined as part of the same photolithography step) as other contact regions in the device.

A voltage is applied to the field plate to create an electric field in the vicinity of the detector's silicide layer. By creating the electric field, the responsivity of the device may be "tuned" so as to adjust the direction and momentum of "hot" carriers (electrons or holes, depending on the conductivity of the silicon) with respect to the Schottky barrier/silicon layer interface. The applied electric field functions to change the direction of movement of the "hot" carriers to align with the preferred direction "normal" to the silicon-silicide interface, allowing for an increased number of carriers to move over the Schottky barrier and add to the generated photocurrent. That is, the inclusion of a biased field plate provides the directional influence required to adjust the direction of the "hot" carriers so as to assist in their injection over the Schottky barrier.

In one embodiment, the actual voltage applied to the field plate is adjusted to modify the directional influence applied to the momentum of the carriers, where the adjustments may also be such that an "opposite" directional influence is applied (which decreases the generated photocurrent). The ability to "tune" the responsivity with an applied voltage is useful in matching the performance of the photodetector to other components in the system.

It has also been discovered that the thickness of the silicide used to form the photodetector plays a relatively small role in device performance, where a silicide layer of thickness up to 500 Å can be used within significant degradation in performance. Thus, it is been found that the detector silicide can be formed during the conventional fabrication process used to form other silicide regions (such as contact regions) and may have the same thickness and microstructure as these other silicide regions and still provide adequate performance as a power monitor detector. This approach is considered to significantly reduce the overall processing complexity of the detector fabrication process, since the same photolithography step and processing steps are used to form the detector silicide layer and the other contact regions.

Other and further embodiments and features of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

As described above, the present invention is directed to a silicon-based Schottky barrier detector including an additional electrode (i.e., "field plate") to apply an electric field across the silicide region of the detector so as to increase the movement of "hot" carriers (either electrons or holes, depending on the conductivity of the silicon; hereinafter described primarily as "hot" electrons) over the Schottky barrier and improve the responsivity of the device. The presence of the electric field will preferentially direct "hot" electrons in the manner required to cross the Schottky barrier (i.e., in a direction normal to the silicide-silicon interface) and thus increase the number of carriers that actually cross the barrier and contribute to the photocurrent. Advantageously, the fabrication process and materials of the inventive detector remain compatible with conventional, planar CMOS process technology associated with the semiconductor industry.

In accordance with the present invention, a Schottky barrier junction is formed on the sub-micron thick, planar silicon waveguiding surface layer ("SOI layer") of an SOI structure. This Schottky barrier junction is formed in such a way that the optical signal propagating laterally along a waveguide within the planar SOI layer (traveling in the direction parallel to the junction) is continuously absorbed into the overlying silicide layer as it passes thereunder. As a result of this geometry, even a relatively thin silicide layer (e.g., a few monolayers thick) will absorb a large portion of the signal over a distance of a few microns.

The field plate layer (preferably fabricated as a metal region of a conventional CMOS multi-layer metallization layer) is positioned above the detector silicide layer and is controlled by an applied voltage to create an electric field across the detector silicide layer. Creating this electric field has been found to modify the direction of the "hot" electrons, resulting in a higher or lower (depending upon the polarity of the applied field) number of "hot" electrons crossing the Schottky barrier and generating a larger (or smaller) photocurrent or responsivity. As will be described in detail below, the responsivity of the detector can be increased or decreased (in general, "tuned"), depending on the polarity of the voltage applied to the field plate layer with respect to the voltage potential between the anode and cathode terminals of the photodetector itself.

Figure 1:
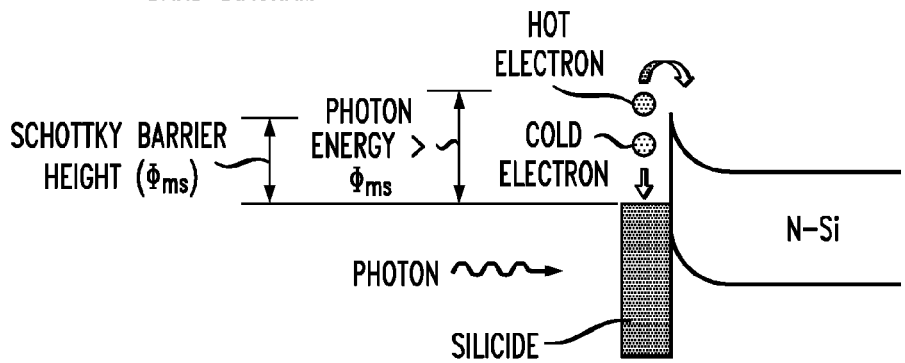
FIG. 1 is a band diagram associated with the operation of a prior art, normal incidence, Schottky barrier photodetector.

The basic operation of a conventional, prior art "normal incidence" Schottky-barrier infrared photodetector is first described so as to form a basis for distinguishing the subject matter of the present invention. Referring to FIG. 1, an energy band diagram is illustrated to describe the operation of such a conventional Schottky-barrier photodetector. The incoming infrared radiation is incident in a normal incidence manner on a silicide layer and results in the excitation of a photocurrent across the Schottky barrier (defined as having a barrier height $\phi_{ms}$) by internal photoemission into an underlying silicon layer. In the arrangement of FIG. 1, it is presumed that the silicon layer comprises an n-type silicon material. Since silicon itself is transparent to IR radiation with a photon energy less than the band gap of silicon (1.12 eV), the silicon layer does not contribute to the photocurrent by absorption of infrared photons (through the creation of electron-hole pairs). Particularly, the infrared photons are absorbed into the silicide layer by transferring their energy and momentum to the free carriers. Indeed, the "hot" electrons (or "hot" holes when using a p-type layer) that have sufficient energy, as well as the requisite directional properties, will go over the Schottky barrier and be injected into the silicon layer, leaving a net positive (negative) charge on the silicide electrode.

In order to improve the performance of the Schottky barrier IR detector to detect radiation in the 1.10-1.65 μm band of interest for optical communications, the previously-cited Patel et al. arrangement proposed the use of a lateral incidence photodetector in place of the conventional normal incidence photodetector structure, the lateral incidence photodetector formed as an integral part of an SOI structure including a sub-micron surface layer waveguide.

Figure 2:
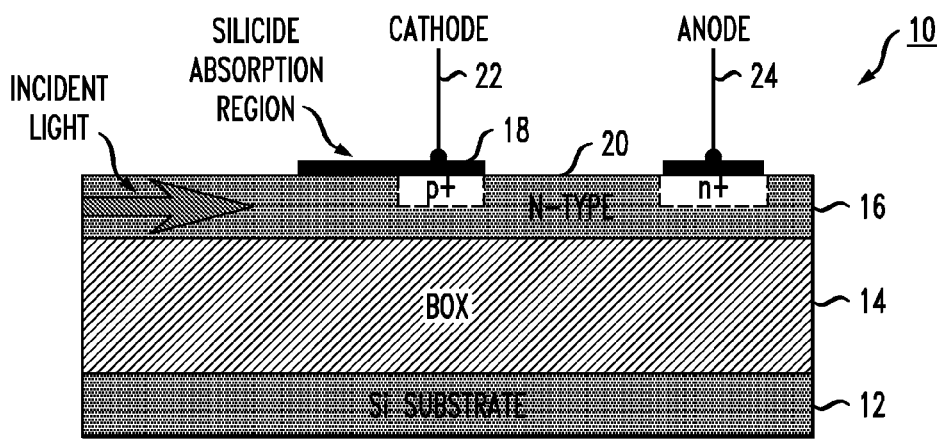
FIG. 2 is a cut-away side view of an exemplary prior art SOI-based silicon photodetector.

FIG. 2 contains a side view of an exemplary Schottky barrier IR photodetector arrangement 10 formed in accordance with the Patel et al. design. Photodetector 10 comprises a conventional "silicon-on-insulator" (SOI) structure, including a silicon substrate 12, insulator layer 14 (usually of $SiO_2$) and a planar silicon surface layer 16 (also referred to as SOI layer 16), where SOI layer 16 is preferably formed to have a thickness of less than one micron and is used to support the propagation of an optical mode therealong, as shown in FIG. 2. It is to be understood that SOI layer 16 may comprise either a planar single crystal silicon or a planar crystalline silicon (or Si—Ge) layer that has been processed to be in a "strained" lattice state (the strained silicon layer exhibiting a higher mobility rate for the carriers by reducing the mean free path length L).

In order to form the metal-semiconductor interface required for a Schottky barrier, a silicide strip 18 is disposed along a portion of top surface 20 of planar SOI layer 16. In practice, any one of the silicides that forms an appropriate Schottky barrier for the wavelength to be detected may be used in the formation of this structure, since the ability to form a silicide on a silicon surface is generally understood in the planar CMOS processing industry. Accordingly, silicides based on cobalt, nickel, molybdenum, tantalum, tungsten and titanium are the most desired silicide layers for telecommunications application (and are also compatible with CMOS processes).

Silicide strip 18 may be formed as a single crystal (which is possible with some silicides), or as a polycrystalline material. For a polycrystalline silicide strip, scattering from grain boundaries plays a role (in association with the strip thickness) in determination of the "gain" factor of the detector. In this case, the processing conditions can be controlled, using well-known means, to optimize the grain formation in the silicide.

A first electrical contact 22 is made to silicide strip 18 so as to form a first electrode of photodetector 10. A second electrical contact 24 is made directly to planar SOI layer 16 along its top surface 20, where first and second contacts 22, 24 are illustrated in FIG. 2. Thus, as an optical beam propagates along planar SOI layer 16, the "hot" electrons injected from silicide strip 18 will result in the generation of a photocurrent between first electrical contact 22 and second electrical contact 24, where a measurement of this photocurrent can then be used as an indication of the optical power of the propagating lightwave signal.

As a result of utilizing this waveguide-based structure for the IR photodetector, it is possible to implement a device that is capable of operating at (or even above) room temperature (which is problematic with the prior art normal incidence detectors). Responsivity in general is a measure of quantum efficiency of the device measured by determining the ratio of generated photocurrent to incoming optical power. More particularly, responsivity R can be defined by the following relation:

$$R = C1 * \left[1 - \left(\frac{\lambda * \phi_{ms}}{1.24}\right)\right]^2,$$

where C1 is a known constant, $\lambda$ is the free space wavelength of the propagating signal and $\phi_{ms}$ is the energy of the Schottky barrier.

Figure 3:
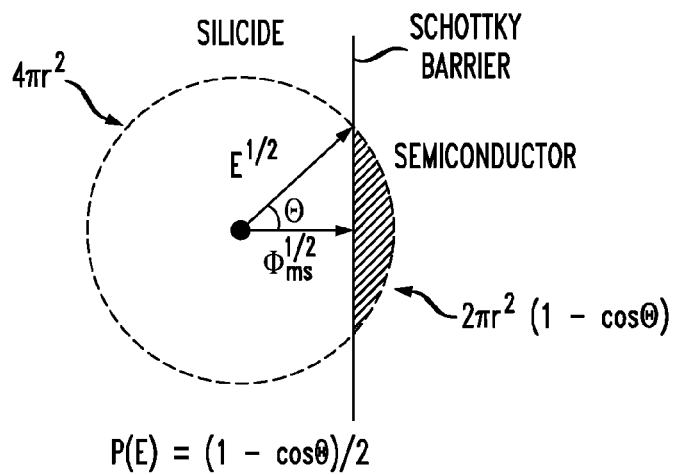
FIG. 3 is a diagram of the solid angle associated with the escape of hot electrons in moment space.

This limitation can be understood with reference to FIG. 3, which is a depiction of the solid angle required for the escape of "hot" electrons into momentum space. The quantities of energy and moment are both illustrated in FIG. 3. While a large number of "hot" electrons are created in the first instance upon incidence of photons on the silicide, only a fraction of the "hot" electrons with energy greater than $\phi_{ms}$ and momentum in a direction nearly normal (perpendicular) to the silicide-silicon interface can cross the Schottky barrier. The diagram in FIG. 3 illustrates vectors associated with both the energy $E^{1/2}$ and momentum $\phi_{ms}^{1/2}$ of the "hot" electrons, where the shaded region denotes the small portion of these electrons in the "nearly normal" region that actually contribute to the photocurrent by having their momentum in a direction nearly normal to the interface. As shown, this "nearly normal" region is associated with a small range of angular distribution around the normal direction.

The responsivity of a photodetector, when defined as the ratio of generated photocurrents/input optical signal power, is clearly associated with the number of hot electrons meeting this "nearly normal" angular directional criterion (defined by the quantity $2\pi r^2(1-\cos\theta)$), shown as the shaded region of FIG. 3. Merely increasing the energy imparted to these carriers is not sufficient to increase the generated photocurrent (and hence responsivity of the detector), unless the direction of momentum is also proper; that is, along a direction nearly normal to the interface between the silicon and silicide. In accordance with the present invention, therefore, an external electric field is applied to the silicide region of the detector, using the field plate configuration, to influence the direction of momentum of the "hot" electrons.

Figure 4:
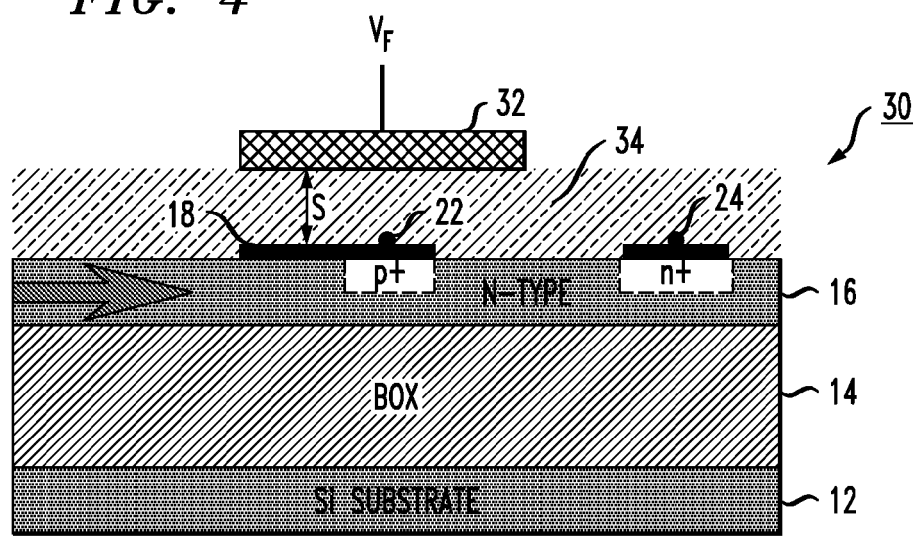
FIG. 4 is a cut-away side view of an exemplary SOI-based Schottky barrier photodetector of the present invention, incorporating a field plate over the silicide layer.

FIG. 4 illustrates an exemplary silicon-based photodetector 30 formed in accordance with the present invention that addresses these limitations of the Patel et al. device. The elements that correspond to the prior art Patel et al. structure carry the same reference numerals. As shown in FIG. 4, photodetector 30 further comprises a field plate 32 disposed above and separated from silicide strip 18. A dielectric region 34 separates field plate 32 from silicide strip 18. Advantageously, field plate 32 is easily incorporated into the standard CMOS process used for the fabrication of opto-electronic devices, where field plate 32 can be incorporated into the processing steps associated with the fabrication of the standard "metal 1" or "metal 2" layers. Moreover, as mentioned above, it has been discovered that silicide strip 18 may itself be fabricated during a conventional set of process steps without the need to "modify" the process to create an ultra-thin silicide strip. This additional realization further simplifies the overall device fabrication process.

In accordance with the present invention, a voltage $V_F$ is applied to field plate 32, which will induce an electric field across silicide strip 18. The presence of the electric field will, as discussed above, influence the direction of the momentum of the "hot" electrons and allow for a greater number of "hot" electrons to escape over the Schottky barrier and increase the generated photocurrent. The applied field across silicide strip 18 will preferentially shift the direction of momentum of these "hot" electrons in the direction normal to the silicon-silicide interface, the desired direction for movement of the carries over the barrier.

It is to be noted that the vertical separation S between field plate 32 and silicide strip 18 influences the responsivity of the device. In particular, the closer field plate 32 is to silicide strip 18, the less applied voltage is needed to create the same strength electric field. However, if field plate 32 is positioned too close to the waveguiding structure, it will absorb a portion of the propagating signal, reducing the sensitivity of photodetector 30. As mentioned above, a preferred metal layer to be used as field plate 32 is the "metal 1" layer of a standard CMOS process; however, a "metal 2" layer can also be used. The spacing between silicide strip 18 and field plate 32 is preferably on the order of 0.2-2.0 µm, with a preferred minimum spacing on the order of about 0.4 µm.

Figure 5:
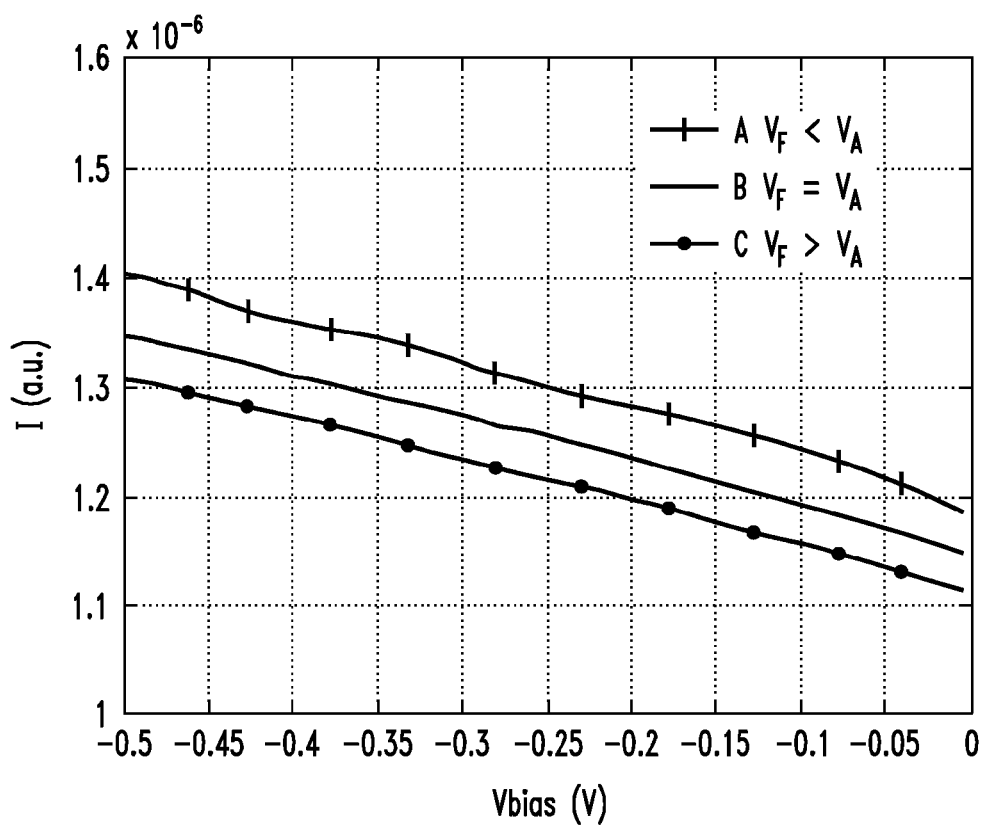
FIG. 5 is a plot of the change in responsivity of the inventive detector, illustrating the ability to "tune" the responsivity as a function of voltage applied to the field plate.

FIG. 5 is a graph of the generated photocurrent as a function of bias voltage ($V_C-V_A$) for three different values of $V_F$. In plot A, $V_F<V_A$; in plot B, $V_F=V_A$; and in plot C, $V_F>V_A$. Plot B is associated with the prior art arrangement, where the voltage applied to field plate 32 does not create an electric field along silicide strip 18. Referring to plot A, if voltage $V_F$ is selected to be less than the voltage present at anode 24 (the contact to SOI layer 16), the created electric field along silicide strip 18 will "add" to the existing field and thus adjust the moment of additional "hot" electrons to be in a direction essentially normal to the material interface. These additional "hot" electrons will then escape over the Schottky barrier and add to the created photocurrent.

As shown in FIG. 5, by adjusting the value of $V_F$, it is possible to "tune" the influence of the applied electric field on the movement of "hot" electrons over the barrier. In fact, it is possible to apply a voltage to field plate 32 that actually subtracts from the nominal value and reduces the responsivity of photodetector 30. Decreasing the responsivity may be desired in situations where there is a need to "match" the responsivity to other system components.

In general, by virtue of the application of a tunable voltage to field plate 32, it is possible to tune the responsivity of the photodetector of the present invention. The tuning may be performed initially upon fabrication to provide a desired responsivity value, or may exist in the finished device as a 'tunable' element that is capable of being adjusted over time in various installations.

While the inventive photodetector has been described in an embodiment where "hot" electrons are the carriers responsible for the generation of the photocurrent, it is to be understood that "hot" holes may be the carriers creating the photocurrent in an arrangement where p-doped silicon is utilized (and the polarity of the voltage applied to the field plate adjusted accordingly).

In light of all of the above, therefore, the present invention is intended to be limited only by the scope of the claims appended hereto.

What is claimed is:

1. A silicon-based infrared photodetector integrated on a silicon-on-insulator (SOI) substrate with an optical waveguide, the SOI substrate including a planar SOT surface layer, the silicon-based infrared photodetector comprising:
    a metallic strip disposed over a portion of the planar SOI surface layer along the direction of propagation of an optical signal along the optical waveguide, the metallic strip forming a Schottky barrier with the optical waveguide;
    a first ohmic contact disposed on the planar SOI surface layer at a first contact area;
    a second ohmic contact disposed on the metallic strip at a second contact area; and
    a field plate electrode disposed over and separated from the metallic strip, wherein the application of a voltage to the field plate electrode modifies the electric field along the metallic strip to preferentially direct the momentum of hot carriers, influencing the number of hot conductors that cross over the Schottky barrier, which in turn modifies the photocurrent generated by the silicon-based infrared photodetector.

2. A silicon-based infrared photodetector as defined in claim 1 where the polarity of the voltage applied to the field plate is controlled to preferentially direct the momentum of hot carriers in a direction nearly normal with respect to the interface between planar SOI surface layer and the metallic strip, increasing the number of hot carriers that cross over the Schottky barrier.

3. A silicon-based infrared photodetector as defined in claim 1 wherein the voltage applied to the field plate is tunable to adjust the number of hot conductors that cross over the Schottky barrier and thereby adjust the sensitivity of the photodetector.

4. A silicon-based infrared photodetector as defined in claim 1 wherein the metallic strip comprises a layer of silicide material disposed during conventional CMOS processing.

5. A silicon-based infrared photodetector as defined in claim 4 wherein the layer of silicide material is processed as a single step with a silicide region used as a contact.

6. A silicon-based infrared photodetector as defined in claim 1 wherein the field plate electrode comprises a portion of a first conductor layer disposed during conventional CMOS processing.

7. A silicon-based infrared photodetector as defined in claim 1 wherein the field plate electrode comprises a portion of a second conductor layer disposed during conventional CMOS processing.

8. A silicon-based infrared photodetector as defined in claim 1 wherein the planar SOI layer is n-doped and the "hot" carriers comprise "hot" electrons.

9. A silicon-based infrared photodetector as defined in claim 1 wherein the planar SOI layer is p-doped and the "hot" carriers comprise "hot" holes.

10. A silicon-based infrared photodetector as defined in claim 1 wherein the field plate electrode is separated from the metallic strip by a distance of no greater than 2 μm.

11. A silicon-based infrared photodetector as defined in claim 1 wherein the field plate electrode is separated from the metallic strip by a distance of no less than 0.2 μm.

12. A silicon-based infrared photodetector as defined in claim 1 wherein the field plate electrode is separated from the metallic strip by a distance of approximately 0.4 μm.

* * * * *

UNITED STATES PATENT AND TRADEMARK OFFICE
CERTIFICATE OF CORRECTION

PATENT NO. : 8,618,625 B2  
APPLICATION NO. : 13/038470  
DATED : December 31, 2013  
INVENTOR(S) : Patel et al.

Page 1 of 1

It is certified that error appears in the above-identified patent and that said Letters Patent is hereby corrected as shown below:

In the Specification:

In the Background of the Invention:

Column 2, Line 12, delete "(SOT)" and insert --(SOI)-- therefor;

Column 2, Line 13, delete "SOT" and insert --SOI-- therefor;

Column 2, Line 14, delete "SOT" and insert --SOI-- therefor;

Column 2, Line 15, delete "SOT" and insert --SOI-- therefor;

Column 2, Line 17, delete "SOT" and insert --SOI-- therefor;

In the Detailed Description:

Column 4, Line 3, delete "("SOT layer")" and insert --("SOI layer")-- therefor;

In the Claims:

Column 7, Claim 1, Line 35, delete "SOT" and insert --SOI-- therefor.

Signed and Sealed this
First Day of April, 2014

Michelle K. Lee
*Deputy Director of the United States Patent and Trademark Office*